United States Patent
Singh et al.

(10) Patent No.: US 7,671,676 B2
(45) Date of Patent: Mar. 2, 2010

(54) CONTINUOUS TIME COMMON-MODE FEEDBACK MODULE AND METHOD WITH WIDE SWING AND GOOD LINEARITY

(75) Inventors: Pratap N Singh, Varanasi (IN); Chandrajit Debnath, Greater Noida (IN); Rakesh Malik, Noida (IN)

(73) Assignee: STMicroelectronics Pvt. Ltd., Greater Noida, UP (IN)

( * ) Notice: Subject to any disclaimer, the term of this patent is extended or adjusted under 35 U.S.C. 154(b) by 0 days.

(21) Appl. No.: 11/900,928

(22) Filed: Sep. 12, 2007

(65) Prior Publication Data

US 2008/0074189 A1 Mar. 27, 2008

(30) Foreign Application Priority Data

Sep. 13, 2006 (IN) .................. 2025/DEL/2006

(51) Int. Cl.
    *H03F 3/45* (2006.01)
(52) U.S. Cl. .................................... 330/258
(58) Field of Classification Search ............. 330/258
    See application file for complete search history.

(56) References Cited

U.S. PATENT DOCUMENTS

| | | | |
|---|---|---|---|
| 4,573,020 A | 2/1986 | Whatley | |
| 5,039,954 A | 8/1991 | Bult et al. | |
| 5,748,040 A | 5/1998 | Leung | |
| 5,764,101 A | 6/1998 | Archer | |
| 6,114,907 A | 9/2000 | Sakurai | |
| 6,177,838 B1 | 1/2001 | Chiu | |
| 6,353,361 B1 | 3/2002 | Sun | |
| 6,362,688 B1 | 3/2002 | Au | |
| 6,411,165 B1 | 6/2002 | Delano | |
| 6,529,070 B1 * | 3/2003 | Nagaraj | 330/9 |
| 6,985,038 B2 * | 1/2006 | Miwa et al. | 330/258 |

OTHER PUBLICATIONS

"FETs as Voltage-Controlled Resistors" Siliconix AN105, Mar. 10, 1997, pp. 1-6.*
Bult, K., Geelen, G., "A fast-settling CMOS operational amplifier for SC circuits with 90-db dc gain," IEEE Journal of Solid State Circuits, Dec. 1990, pp. 1379-1394, vol. 25, No. 6.
Gray, Paul. R., et al., "Neutralization", Analysis and Design of Analog Integrated Circuits, Feb. 14, 2001, pp. 849-850, 4th Ed.
Ahmadi, M. M., "A New Modeling and Optimization of Gain-Boosting Amplifier for High-Speed and Low-Voltage Applications", IEEE Transaction on Circuits and Systems II, Mar. 2006, pp. 169-173, vol. 53, Issue 3.

* cited by examiner

*Primary Examiner*—Robert Pascal
*Assistant Examiner*—Khiem D Nguyen
(74) *Attorney, Agent, or Firm*—Lisa K. Jorgenson; Paul F. Rusyn; Graybeal Jackson LLP (57) ABSTRACT

A continuous time common mode feedback module is capable of operating in a wide range of input voltages. The common mode feedback module includes a common mode detector and an amplifier for computing and amplifying the difference of a reference voltage and a common mode voltage of a first input signal and a second input signal. The common-mode feedback module includes a common mode resolver and a control voltage generating module coupled to each other to provide a common mode feedback voltage. The common mode feedback module provides a good linearity and a wide bandwidth, without compensation requirements. The common mode feedback module also provides small process corner dependence of bias current and a common mode offset.

14 Claims, 8 Drawing Sheets

CONTINUOUS TIME COMMON-MODE FEEDBACK MODULE AND METHOD WITH WIDE SWING AND GOOD LINEARITY

PRIORITY CLAIM

This application claims priority from Indian patent application No. 2026/Del/2006, filed Sep. 12, 2006, which is incorporated herein by reference.

TECHNICAL FIELD

Embodiments of the present invention relate to common-mode feedback (CMFB) circuits and more specifically to a wide swing, continuous time common-mode feedback (CMFB) circuit providing a good linearity with wide bandwidth and low systematic offsets.

BACKGROUND

Common-mode feedback circuits stabilize the common mode voltage of differential outputs by adjusting the common mode bias currents. The two differential output voltages are averaged to form a common-mode voltage. The common-mode voltage is compared with a designated reference common-mode voltage. The difference is then amplified and converted into a common-mode output current to adjust the common-mode voltage. Most commonly used common mode feedback circuits fall into the following three categories: (a) Switched Capacitor CMFB, (b) Resistor averaged CMFB, (c) Differential Difference amplifier CMFB.

Figure 1:
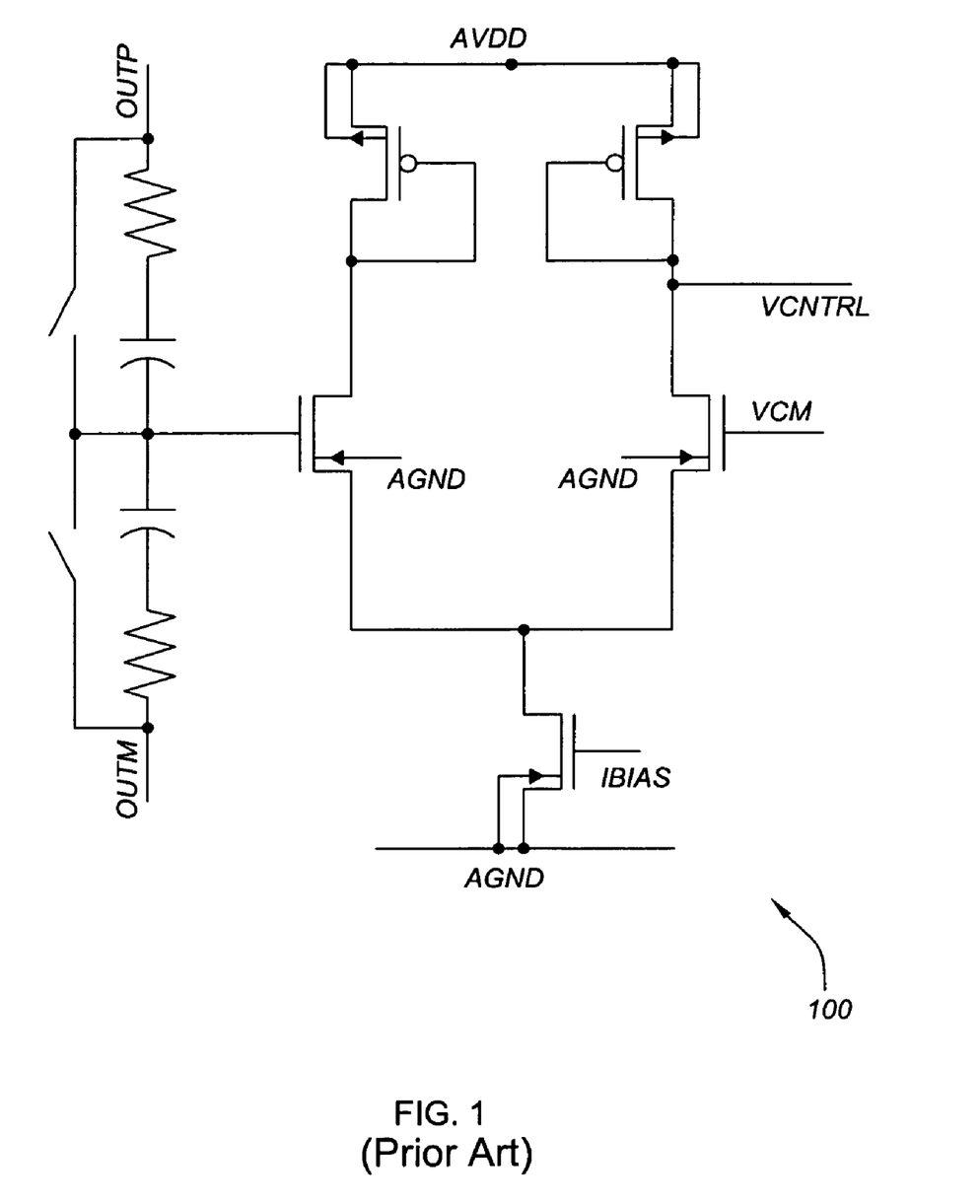
FIG. 1 illustrates a conventional circuit diagram of a switched capacitor common mode feedback circuit.

FIG. 1 illustrates a conventional circuit diagram of a switched capacitor common mode feedback (CMFB) circuit 100. The switched capacitor circuit 100 samples a common mode of outputs in one phase of the clock and controls common mode in another phase of the clock so there is no instantaneous control. A capacitor at the output reduces the effective bandwidth of an amplifier. A common mode control voltage is very sensitive to a parasitic which results in a common mode offset. Charge fed through from switches produces additional offset to the common mode. The effect of the charge fed through can be reduced by increasing the sampling capacitor but it increases output loading hence reduces bandwidth.

Figure 2:
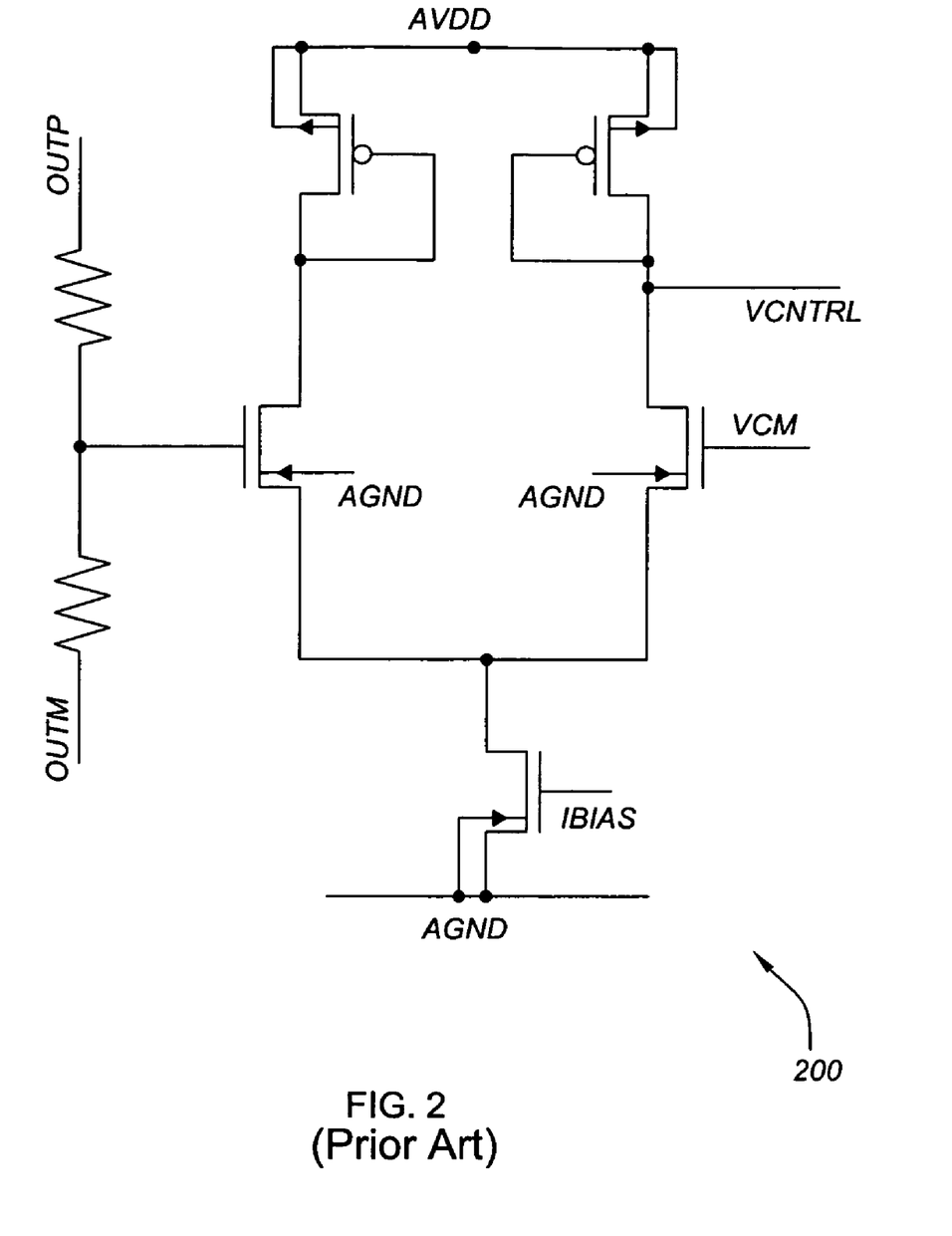
FIG. 2 illustrates a conventional circuit diagram of a resistor averaged common mode feedback circuit.

FIG. 2 illustrates a conventional circuit diagram of a resistor averaged common mode feedback (CMFB) circuit 200. The resistor averaged circuit 200 has advantages of instantaneous control of a common mode and minimum common mode offset because of no parasitic sensitivity and clock feed through. But a resistor at an output reduces gain by reducing output impedance. This problem is removed by buffering the outputs. But a buffer at the output reduces the output swing. So swing is lower than the switched capacitor CMFB 100 and buffers of outputs reduce a phase margin which leads to stability problems.

Figure 3:
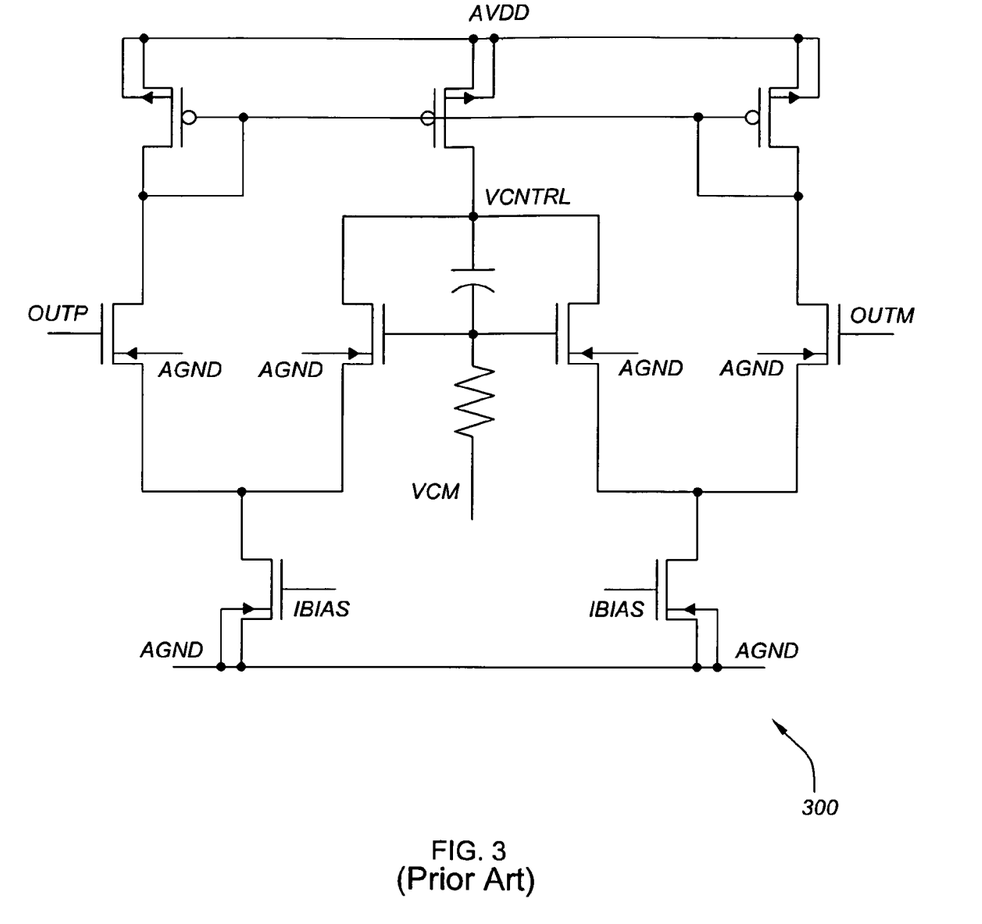
FIG. 3 illustrates a conventional circuit diagram of a differential difference amplifier common mode feedback circuit.

FIG. 3 illustrates a conventional circuit diagram of a differential difference amplifier common mode feedback (CMFB) circuit 300. The differential difference amplifier circuit 300 has an inherent buffering of outputs, so it has all the advantages of a resistor averaged circuit 200 (CMFB), except linearity. The circuit 300 has a worse linearity than both the circuits 100 and 200. But the linearity can be improved by increasing the channel lengths of input transistors and a gain of a common mode amplifier. But it has lower swing and requires a compensation to improve stability.

In another approach an operational amplifier having differential inputs and differential outputs with a predetermined common-mode output voltage independent of common-mode input voltage and an input voltage variation is provided. D.C. common-mode feedback is utilized to provide a differential amplifier having a precise common-mode output voltage, which is similar to the CMFB circuit 300 as illustrated in FIG. 3.

Therefore, there is a need for a novel continuous time common-mode feedback (CMFB) module that can provide a wider swing and a good linearity and which provides a wide bandwidth and a low systematic offset.

SUMMARY

Embodiments of the present invention provide a common mode feedback module which operates within a wider voltage range of inputs in continuous time and provide a common mode feedback module providing a good linearity and a low input capacitance and high output impedance.

According to one embodiment of the present invention a common mode feedback module includes a common-mode resolver receiving a first input signal and a second input signal for generating a common mode current, and a control voltage generating module operatively coupled to the common mode resolver for generating a common-mode feedback voltage.

Another embodiment of the present invention provides an operational amplifier including one or more stages of differential amplifier for generating differential output voltages, and a common-mode feedback module operatively coupled to the one or more stages of differential amplifier receiving a first input signal and a second input signal for providing a common-mode feedback voltage.

According to another embodiment of the present invention a method for generating a common-mode feedback voltage in a common-mode feedback module with a wide swing and a good linearity includes providing a first input signal and a second input signal, generating a common mode current through a first transistor, a second transistor, a first resistor, and a second resistor, generating a reference current through a fifth transistor and a third resistor, comparing the common mode current and the reference current, and generating a common-mode feedback voltage based on a proportional difference of the common mode current and the reference current.

BRIEF DESCRIPTION OF THE DRAWINGS

The aforementioned embodiments and other features of the present invention will be explained in the following description, taken in conjunction with the accompanying drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 4:
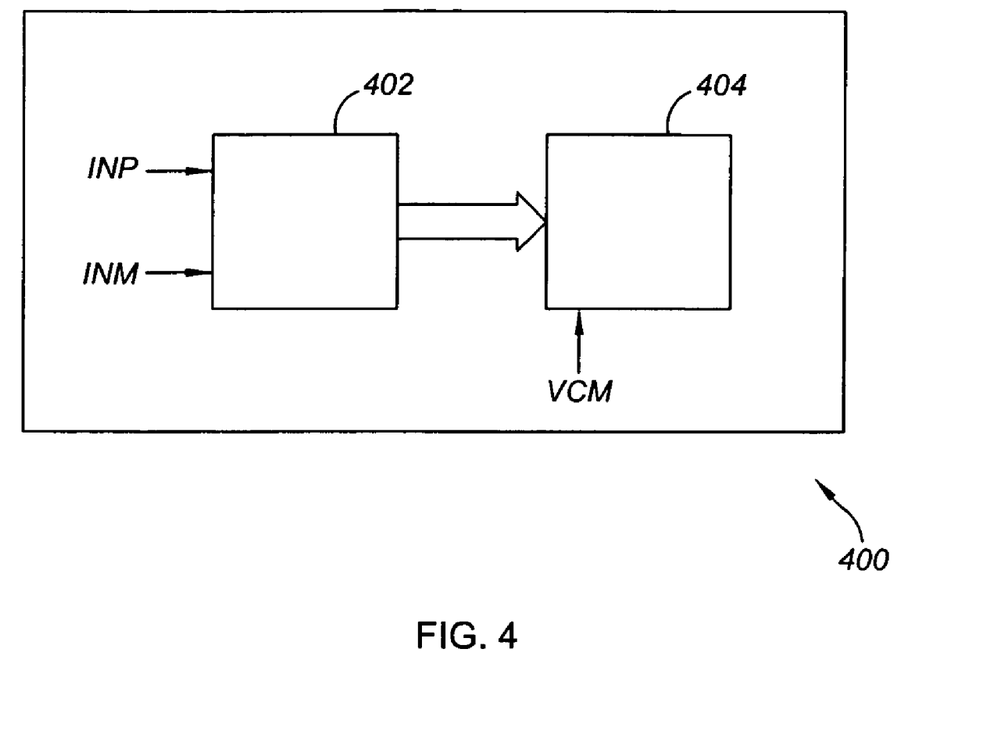
FIG. 4 illustrates a block diagram of a common mode feedback module according to one embodiment of the present invention.

FIG. 4 illustrates a block diagram of a common mode feedback module 400 according to one embodiment of the present invention. The common mode feedback module 400 includes a common mode resolver 402 and a control voltage generating module 404. The common mode resolver 402 receives a first input signal INP and a second input signal INM for generating a common mode current. The control voltage generating module 404 receives a reference common mode voltage VCM. The control voltage generating module 404 is connected to the common mode resolver 402 for generating a common mode feedback voltage.

Figure 5:
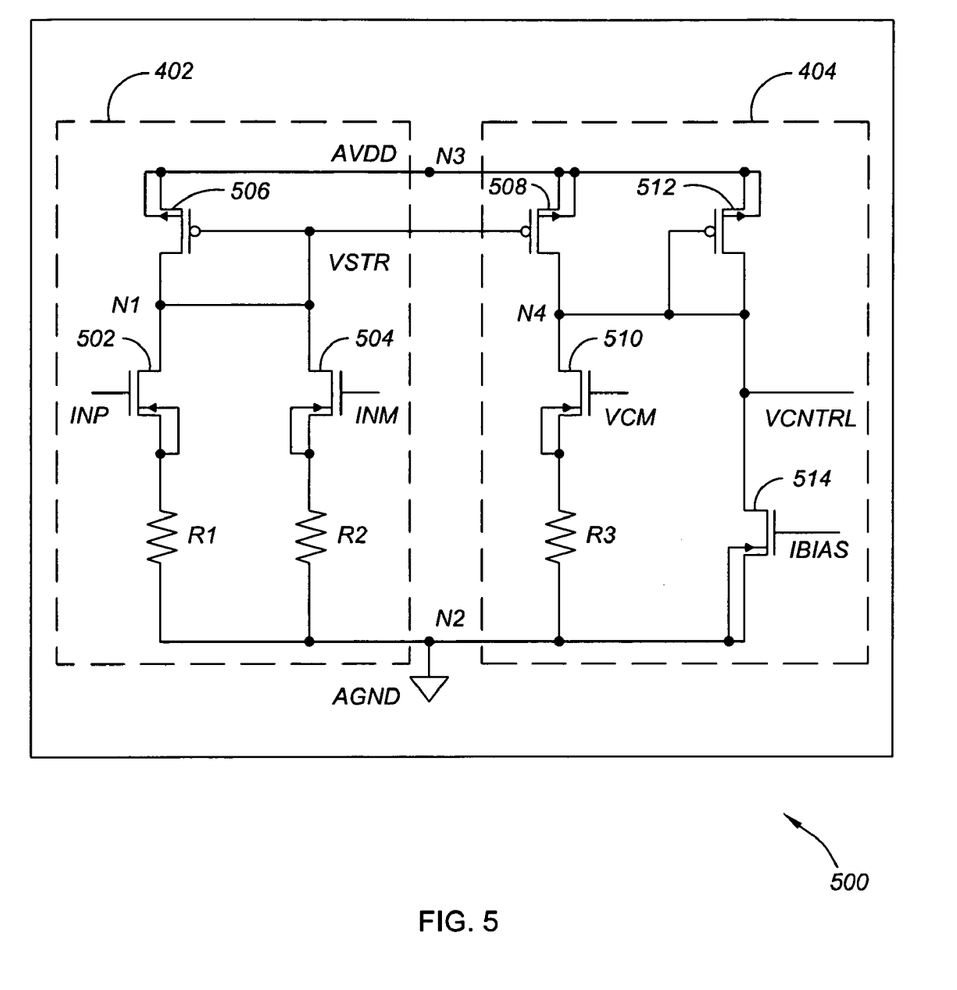
FIG. 5 illustrates a schematic circuit diagram of a common mode feedback module according to one embodiment of the present invention.

FIG. 5 illustrates a schematic circuit diagram of a common mode feedback module 500 according to an embodiment of the present invention. The common mode feedback module 500 includes a common mode detector and an amplifier for computing and amplifying a difference of a reference common mode voltage VCM and a common mode input voltage of a first input signal INP and a second input signal INM.

The common mode feedback module 500 includes the common mode resolver 402 and the control voltage generating module 404. The common mode resolver 402 includes multiple transistors such as 502, 504, and 506 and multiple resistors such as R1, R2 coupled to each other to provide a common mode current. The control voltage generating module 404 includes multiple transistors, such as 508, 510, 512, and 514 and a resistor R3 to provide a common mode feedback voltage. A first transistor 502 is connected between a first node N1 and a second node N2 through a first resistor R1 and receives the first input signal INP at a gate terminal. The first resistor R1 is connected between a second supply voltage AGND through the second node N2, and to a source terminal and to a bulk terminal of the first transistor 502. The bulk terminal of the first transistor 502 can alternatively be connected directly to the second supply voltage AGND for compromising a swing. A second transistor 504 is connected between the first node N1 and the second node N2 through a second resistor R2 for receiving the second input signal INM at a gate terminal. The second resistor R2 is connected between the second supply voltage AGND through the second node N2, and to a source terminal and to a bulk terminal of the second transistor 504. The bulk terminal of the second transistor 504 can alternatively be directly connected to the second supply voltage AGND for compromising a swing. A third transistor 506 has a gate terminal and a drain terminal connected to the first node N1, and a source terminal and a bulk terminal connected to a third node N3 for receiving a first supply voltage AVDD.

A fourth transistor 508 has a gate terminal connected to the gate terminal of the third transistor 506, a drain terminal connected to a fourth node N4, and a source terminal and a bulk terminal connected to the third node N3 for receiving the first supply voltage AVDD. A fifth transistor 510 is coupled between the fourth node N4 and the second node N2 through a third resistor R3 and receives a reference common mode voltage VCM at a gate terminal. The third resistor R3 is connected between the second supply voltage AGND through the second node N2, and to a source terminal and a bulk terminal of the fifth transistor 510. The bulk terminal of the fifth transistor 510 can alternatively be directly connected to the second supply voltage AGND for compromising a swing.

A sixth transistor 512 has a gate terminal and a drain terminal connected to the fourth node N4, and a source terminal and a bulk terminal connected to the third node N3 for receiving the first supply voltage AVDD. In an embodiment, the gate terminal and the drain terminal are connected to the fourth node N4 and VCNTRL node respectively but not connected to each other. A seventh transistor 514 having a source and a bulk terminal connected to the second node N2 for receiving the second supply voltage AGND, a gate terminal for receiving a bias current signal IBIAS to the common mode feedback module 500 and a drain terminal connected to the fourth node N4 for generating a common-mode feedback voltage VCNTRL. In an embodiment of the present invention, the first transistor 502, the second transistor 504 and the fifth transistor 510 are n-channel metal oxide semiconductor (MOS) transistors and the third transistor 506, the fourth transistor 508 and the sixth transistor 512 are p-channel metal oxide semiconductor (MOS) transistors.

In an embodiment of the common mode feedback module 500, a first pair of NMOS transistors 502, 504 receives differential output voltages OUTP, OUTM from differential outputs of 500, as described in FIG. 5, to input terminal ports INP, INM of the common mode feedback module 500. The gate of the transistor 502 is connected to an input terminal port INP, the drain of the transistor 502 is connected to a drain of another PMOS transistor 506. The source of the transistor 502 is connected to one terminal of the resistor R1; the source and the bulk terminals of the transistor 502 are connected together. The gate terminal of the transistor 504 is connected to other input terminal port INM, the drain of the transistor 504 is connected to the drain of the PMOS transistor 506. The source of the transistor 504 is connected to one terminal of the resistor R2; the source and the bulk terminals of the transistor 504 are connected together. Other terminals of resistors R1, R2 are connected to the supply voltage rail AGND. The drain and the gate terminals of the PMOS 506 are connected together with drains of the transistors 502, 504. The source terminals of the PMOS 506, 508 are connected to the supply rail AVDD, which is the source of power to the common mode feedback module 500. The gate terminals of the transistors 506 and 508 are connected together. The drain of the transistor 508 is connected to the gate of the transistor 512 and drains of the transistors 510, 512, and 514 as an output port terminal VCNTRL. The gate of the transistor NMOS 510 is connected to a common mode reference input port terminal VCM. The source and the bulk terminals of the transistor 510 are connected to one terminal of the resistor R3, and other terminal of R3 is connected to the power supply terminal AGND, which works as a sink of current for the CMFB module. The gate terminal of the NMOS 514 is connected to an input port IBIAS of the CMFB and the source is connected to the power supply terminal AGND.

Figure 6:
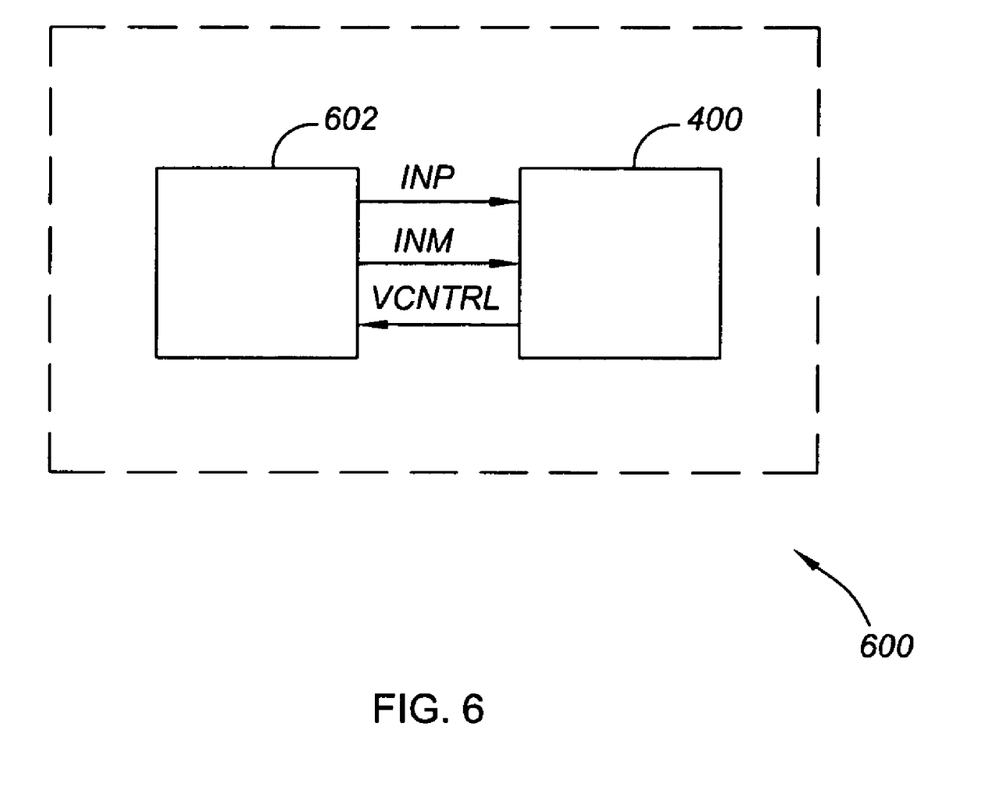
FIG. 6 illustrates a block diagram of an operational amplifier utilizing a common mode feedback module according to one embodiment of the present invention.

FIG. 6 illustrates a block diagram of an operational amplifier (OPAMP) utilizing a common mode feedback module (see FIGS. 4 and 5, for example) according to an embodiment of the present invention. The operational amplifier 600 includes one or more stages of differential amplifier 602 and a common-mode feedback module 400. The one or more stages of differential amplifier 602 generate differential output voltages. The common-mode feedback module 400 is connected to the one or more stages of differential amplifier 602 to receive a first input signal INP and a second input signal INM for providing a common mode feedback voltage VCNTRL.

Figure 7:
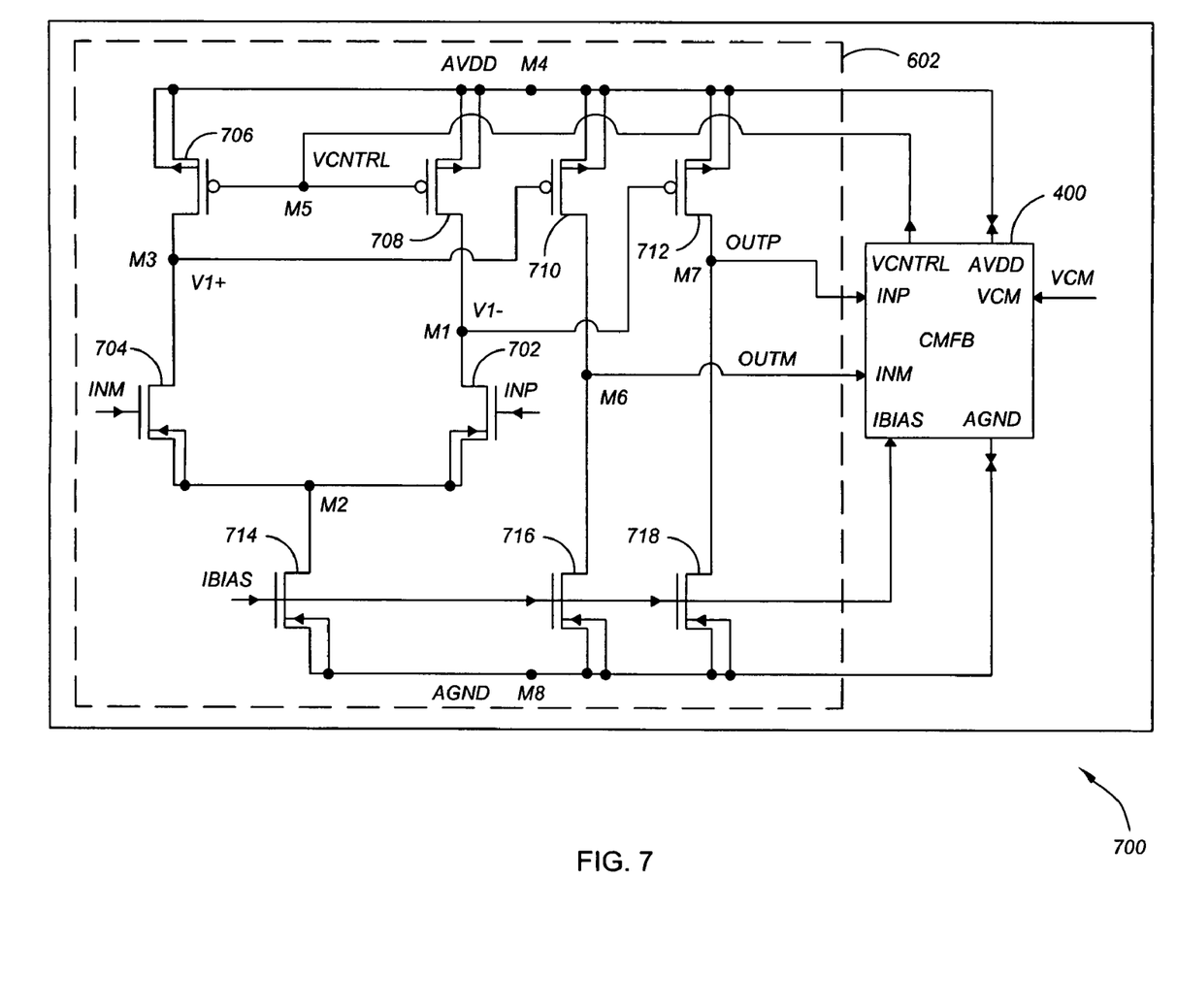
FIG. 7 illustrates a schematic circuit diagram of a two stage operational amplifier utilizing a common mode feedback module according to one embodiment of the present invention.

FIG. 7 illustrates a schematic circuit diagram of a two stage operational amplifier 700 (OPAMP) having a common mode feedback module according to an embodiment of the present invention. The operational amplifier 700 includes multiple active elements and a common-mode feedback module 400 coupled to each other to provide desired amplified signal.

A first active element 702 is connected between a first port M1 and a second port M2 and receives a first input signal INP at a gate terminal. A second active element 704 is connected between the second port M2 and a third port M3 and receives a second input signal INM at a gate terminal. A third active element 706 has a drain terminal connected to the third port M3, and a source terminal and a bulk terminal connected to a fourth port M4 and receives a common-mode feedback voltage VCNTRL at a gate terminal through a fifth port M5. A fourth active element 708 has a drain terminal connected to the first port M1, and a source terminal and a bulk terminal connected to the fourth port M4 and receives the common-mode feedback voltage VCNTRL at a gate terminal through the fifth port M5. A fifth active element 710 has a gate terminal connected to the third port M3, a drain terminal connected to a sixth port M6, and a source terminal and a bulk terminal connected to the fourth port M4 for generating the second input signal INM at the sixth port M6. A sixth active element 712 has a gate terminal connected to the first port M1, a drain terminal connected to a seventh port M7, and a source terminal and a bulk terminal connected to the fourth port M4 for generating the first input signal INP at the seventh port M7.

A seventh active element 714 has a drain terminal connected to the second port M2, and a source terminal and a bulk terminal connected to a eighth port M8 and receives a bias current signal IBIAS at a gate terminal. An eighth active element 716 has a drain terminal connected to the sixth port M6, and a source terminal and a bulk terminal connected to the eighth port M8 for receiving the bias current signal IBIAS at a gate terminal. A ninth active element 718 has a drain terminal connected to the seventh port M7, and a source terminal and a bulk terminal connected to the eighth port M8 and receives the bias current signal IBIAS at a gate terminal. The common-mode feedback module 400 is connected between the fifth port M5, the sixth port M6, the seventh port M7 and a reference common-mode voltage (VCM) terminal for providing the common-mode feedback voltage VCNTRL at the fifth port M5. The module 400 is connected between the fourth port M4, the eighth port M8 and a bias (IBIAS) terminal for initializing and then bringing the module 400 into a steady state condition.

An operational amplifier in general contains two or more differential amplifier stages, using conventional symbols. In an embodiment, the amplifier 700 is a two stage fully differential input/output class A output stage operational amplifier. Transistors 702, 704 forms the differential pair input stage. MOSFETs 714, 716, 718 establishes bias currents and MOSFETs 706, 708 provide active load for input stage and transistors 710, 712 provide active load for the outputs. The differential output signals V1+, V1− of differential input stage are the drain terminals of active load of the MOSFETs 706, 708 respectively. The class A output stage comprises active load MOSFETs 710, 712 and current mirrors 716, 718 respectively. As in the first stage of the operational amplifier in which both inputs and outputs are fully differential the common mode feedback module (CMFB) required to set the common mode voltage of the first stage outputs to a particular reference voltage level, when a differential input voltage is applied to the inputs of the first stage.

Figure 8:
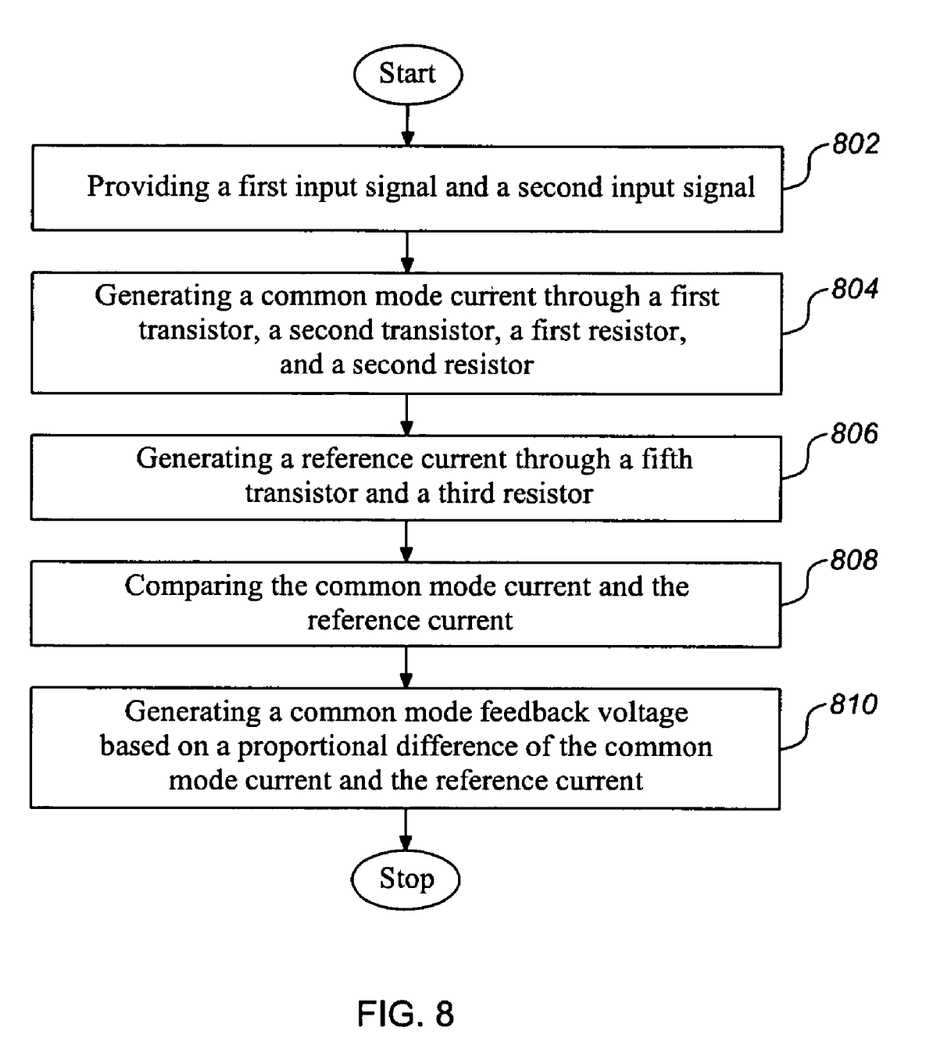
FIG. 8 illustrates a flow diagram of a method for generating a common-mode feedback voltage according to an embodiment of the present invention.

FIG. 8 illustrates a flow diagram of a method for generating a common mode feedback voltage in a common mode feedback module (CMFB) according to an embodiment of the present invention. At step 802, a first input signal and a second input signal are provided. At step 804, a common mode current is generated through a first transistor, a second transistor, a first resistor, and a second resistor. At step 806, a reference current is generated through a fifth transistor and a third resistor. At step 808, the common mode current and the reference current are compared. At step 810, a common-mode feedback voltage is generated based on a proportional difference of the common mode current and the reference current.

In an embodiment of the present invention, the operation is described using FIG. 5 and FIG. 6. Assume the operational amplifier 600 and the CMFB 500 are in steady state condition and current through transistors 506 and 508 are matched according to their geometric ratios. If common mode of inputs i.e. (INP+INM)/2 of the CMFB 500 are equal to a reference common-mode voltage VCM then the common mode feedback voltage VCNTRL will be such that it will mirror currents through the transistor 512 of the CMFB 500 to the transistors 506, 508 in their geometric ratios to force common mode of outputs i.e. (OUTP+OUTM)/2 of the amplifier 600 equal to the reference common-mode voltage VCM. Transistors 506, 508 have geometric ratios 2:1 and transistors 502, 504 and 510 have equal geometries and resistances R1, R2 and R3 have equal values.

Drain current of transistor 502, $$I_P \approx (V_{INP} - V_{THN})/R \; (V_{THN} \text{ is threshold voltage of NMOS})$$

Drain current of transistor 504, $$I_N \approx (V_{INM} - V_{THN})/R$$

Drain current of transistor 510, $$I_{CM} \approx (V_{VCM} - V_{THN})/R \qquad (1)$$

$$I_P + I_N \approx (V_{INP} + V_{INM} - 2 \times V_{THN})/R \qquad (2)$$

Drain current of transistor 506, $$I_{M3} \approx I_P + I_N$$

Equation (2) states that the $I_{M3}$ has no sensitivity to differential input voltage hence common mode feedback loop.

Drain current of the transistor 508 is $I_{M3}/2$ because of their geometric ratio, therefore from (1) and (2) we get $$V_{VCM} - V_{THN} = (VINP + V_{INM} - 2 \times V_{THN})/2$$

$$V_{VCM} = (VINP + V_{INM})/2 \qquad (3)$$

The closed loop equation (3) is a steady state condition if a drain current of the transistor 514 is equal to drain current through the transistor 512 and the VCNTRL is such that currents through transistors 512, 510 and 506 are matched according to their geometric ratios.

If common mode voltage of inputs of 500 is different from $V_{CM}$ then $I_{M4}$ will differ from $I_{CM}$ and extra current will flow through the transistor 512 hence the VCNTRL will change to the correct common mode voltage. If the common mode voltage is greater than the VCM then $I_{M4}$ will be greater than $I_{CM}$ and current through the transistor 512 will be reduced resulting in increase of the VCNTRL which will tend to reduce the common mode voltage. Similarly, a decrease of the common mode voltage will be restored as equation (2) has no first order dependence on a differential input voltage. There are other possibilities like a gain can be increased by breaking the gate-drain of diode connected the NMOS 512 of the CMFB 500 and if an offset to the reference voltage VCM is affordable then the transistors 512 and 514 can be removed.

Common-mode feedback modules according to the described embodiments have a wider swing of inputs, because bias currents are decided by resistors and a minimum input voltage is decided by $V_T$ of NMOS input pairs. Second, the novel modules provide high input impedance and a low input capacitance, so as OPAMP outputs are loaded minimal. Third, the modules provide controlling of linearity by increasing resistance values and aspect ratio of input MOS transistors. Fourth, the modules have no need of compensation network for phase margin of a CMFB loop since it's a low gain stage.

Operational amplifiers including CMFB modules according to embodiments of the present invention may be utilized in a variety of different types of electronic circuits and systems, such as portable devices like cell phones and personal digital assistants (PDAs), as well as in computer systems, communications and control systems, and so on.

From the foregoing it will be appreciated that, although specific embodiments of the invention have been described herein for purposes of illustration, various modifications may be made without deviating from the spirit and scope of the invention.

We claim:

1. A common mode feedback module comprising:
a common-mode resolver receiving a first input signal and a second input signal for generating a common mode current;
a control voltage generating module operatively coupled to the common mode resolver for generating a common-mode feedback voltage; and
wherein the common-mode resolver comprises:
a first transistor operatively coupled between a first node and a second node through a first resistor for receiving the first input signal at a gate terminal, the first resistor having value that sets the value of a current that flows through the first transistor responsive to the first input signal;
a second transistor operatively coupled between the first node and the second node through a second resistor for receiving the second input signal at a gate terminal, the second resistor having a value that sets the value of a current that flows through the second transistor responsive to the second input signal, wherein the value of the second current is independent of the value of the first current; and
a third transistor having a gate terminal and a drain terminal connected to the first node, and a source terminal and a bulk terminal connected to a third node for receiving a first supply voltage.

2. The module as claimed in claim 1, wherein said first resistor being connected between the second supply voltage through the second node, and a source terminal and a bulk terminal of the first transistor.

3. The module as claimed in claim 1, wherein said second resistor being connected between the second supply voltage through the second node, and a source terminal and a bulk terminal of the second transistor.

4. A common mode feedback module comprising:
a common-mode resolver receiving a first input signal and a second input signal for generating a common mode current;
a control voltage generating module operatively coupled to the common mode resolver for generating a common-mode feedback voltage; and
wherein the control voltage generating module comprises:
a first transistor having a gate terminal connected to a first node, a drain terminal connected to a second node, and a source terminal and a bulk terminal connected to a third node for receiving a first supply voltage;
a second transistor operatively coupled between the second node and a third node through a third resistor for receiving a reference common mode voltage at a gate terminal;
a third transistor having a gate terminal and a drain terminal connected to the second node, and a source terminal and a bulk terminal connected to the third node for receiving the first supply voltage; and
a fourth transistor having a source and a bulk terminal connected to third node for receiving a second supply voltage, a gate terminal for providing a bias current to said control voltage generating module and a drain terminal connected to the second node for generating the common-mode feedback voltage.

5. The module as claimed in claim 4, wherein said third resistor being connected between the second supply voltage through the second node, and a source terminal and a bulk terminal of the fifth transistor.

6. An operational amplifier, comprising:
one or more differential amplifier stages for generating differential output voltages; and
a common-mode feedback module operatively coupled to the differential amplifier stages and receiving a first input signal and a second input signal for providing a common-mode feedback voltage, wherein the common-mode feedback module comprises,
a common-mode resolver circuit receiving a first input signal and a second input signal for generating a common mode current; and
wherein the common-mode resolver circuit comprises,
a first transistor operatively coupled between a first node and a second node through a first resistor for receiving the first input signal at a gate terminal;
a second transistor operatively coupled between the first node and the second node through a second resistor for receiving the second input signal at a gate terminal; and
a third transistor having a gate terminal and a drain terminal connected to the first node, and a source terminal and a bulk terminal connected to a third node for receiving a first supply voltage; and
a control voltage generating circuit coupled to the first signal node of the first transistor in the common-mode resolver circuit and operable responsive to a signal on this first signal node to apply a common-mode feedback signal to at least one of the differential amplifier stages, wherein the control voltage generating circuit comprises,
a fourth transistor having a gate terminal connected to the first node, a drain terminal connected to a fourth node, and a source terminal and a bulk terminal connected to the third node for receiving the first supply voltage;

a fifth transistor operatively coupled between the fourth node and the second node through a third resistor for receiving a reference common mode voltage at a gate terminal;

a sixth transistor having a gate terminal and a drain terminal connected to the fourth node, and a source terminal and a bulk terminal connected to the third node for receiving the first supply voltage; and a seventh transistor having a source and a bulk terminal connected to the second node for receiving the second supply voltage, a gate terminal for providing a bias current to said module and a drain terminal connected to the fourth node for generating the common-mode feedback voltage.

7. A method for generating a common mode feedback voltage in a common mode feedback module with a wide swing and a good linearity, comprising:

generating a first common mode current through a first transistor and first resistor responsive to a first input signal;

generating a second common mode current through a second transistor and a second resistor responsive to a second input signal, the second common mode current having a value that is independent of a value of the first common mode current;

generating a reference current through a third transistor and a third resistor;

comparing the common mode current and the reference current; and generating a common-mode feedback voltage based on a proportional difference of the common mode current and the reference current.

8. A common mode feedback circuit comprising:

a common-mode resolver circuit having a first node adapted to receive a first supply voltage and a second node adapted to receive a second supply voltage, the common-mode resolver circuit comprising, a first transistor adapted to receive a first input signal on a control node and having first and second signal nodes;

a first resistive element coupled between the second signal node of the first transistor and the second node;

a second transistor adapted to receive a second input signal on a control node and having a first signal node coupled to the first signal node of the first transistor and having a second signal node;

a second resistive element coupled between the second signal node of the second transistor and the second node; and a diode-coupled transistor coupled between the first signal node of the first transistor and the first node; and a control voltage generating circuit coupled to the first signal node of the first transistor and operable responsive to a signal on this first signal node to generate a common-mode feedback signal.

9. The common mode feedback circuit of claim 8 wherein the first and second transistors are NMOS transistors.

10. The common mode feedback circuit of claim 8 wherein the diode-coupled transistor is a PMOS transistor.

11. The common mode feedback circuit of claim 8 wherein the first and second resistive elements are resistors.

12. An electronic system, comprising:

electronic circuitry including an operational amplifier, the operational amplifier comprising, a differential amplifier;

a common-mode feedback circuit coupled to the differential amplifier, the common-mode feedback circuit comprising, a common-mode resolver circuit having a first node adapted to receive a first supply voltage and a second node adapted to receive a second supply voltage, the common-mode resolver circuit comprising, a first transistor adapted to receive a first input signal on a control node and having first and second signal nodes;

a first resistive element coupled between the second signal node of the first transistor and the second node;

a second transistor adapted to receive a second input signal on a control node and having a first signal node coupled to the first signal node of the first transistor and having a second signal node;

a second resistive element coupled between the second signal node of the second transistor and the second node; and a diode-coupled transistor coupled between the first signal node of the first transistor and the first node; and a control voltage generating circuit coupled to the first signal node of the first transistor and operable responsive to a signal on this first signal node to generate a common-mode feedback signal.

13. The electronic system of claim 12 wherein the electronic circuitry comprises circuitry contained in a portable electronic device such as one of a cellular telephone and portable digital assistant.

14. The electronic system of claim 12 wherein the electronic circuitry comprises circuitry contained in one of a computer system, control system, and a communications system.

* * * * *

UNITED STATES PATENT AND TRADEMARK OFFICE
CERTIFICATE OF CORRECTION

PATENT NO. : 7,671,676 B2  Page 1 of 1
APPLICATION NO. : 11/900928
DATED : March 2, 2010
INVENTOR(S) : Pratap N. Singh et al.

It is certified that error appears in the above-identified patent and that said Letters Patent is hereby corrected as shown below:

- In Claim 1, Column 7, Line 45 of the patent, "having value that sets the value" should read --having a value that sets the value--.

Signed and Sealed this

Twentieth Day of April, 2010

David J. Kappos
*Director of the United States Patent and Trademark Office*